United States Patent [19]

Greene et al.

[11] Patent Number: 5,163,005

[45] Date of Patent: Nov. 10, 1992

[54] METHOD OF CLONING PRINTED WIRING BOARDS

[75] Inventors: Steven D. Greene, Loomis; Michael C. Ford, Sacto; Douglas A. Froom, Orangevale; Rodney E. Wagner, Woodland, all of Calif.

[73] Assignee: The United States of America as represented by the Secretary of the Air Force, Washington, D.C.

[21] Appl. No.: 629,944

[22] Filed: Dec. 19, 1990

[51] Int. Cl.$^5$ .................. G06F 15/62; B23C 1/16
[52] U.S. Cl. ..................... 364/468; 29/829; 409/93; 409/96; 354/354
[58] Field of Search .......... 364/468, 489, 490, 474.03; 29/829, 426.1; 354/354; 378/95; 382/8; 409/85, 93, 96; 430/146, 147, 170, 966

[56] References Cited

U.S. PATENT DOCUMENTS

| | | | |
|---|---|---|---|
| 3,430,564 | 3/1969 | Silvia et al. | 102/22 |
| 3,564,358 | 2/1971 | Hahnlein | 317/235 |
| 3,584,549 | 6/1971 | Leenhouts | 354/354 |
| 3,721,838 | 3/1973 | Brickman et al. | 307/303 |
| 3,945,827 | 3/1976 | Brown | 430/314 |
| 4,120,583 | 10/1978 | Hyatt | 364/490 |
| 4,138,924 | 2/1979 | Seebach | 409/96 |
| 4,295,198 | 10/1981 | Copeland et al. | 364/515 |
| 4,366,424 | 12/1982 | McKechnie | 364/182 |
| 4,766,516 | 8/1988 | Ozdemir et al. | 361/380 |
| 4,866,629 | 9/1989 | Chen | 364/468 |

OTHER PUBLICATIONS

Dept. USAF Letter, "PWB Remanufacture in Late 1970's and Early 1980's", J. E. Sales, Jul. 10, 1991, 5 pages.
"Big Hand for a Beginner", Dupont Magazine, Jul.-/Aug. 1991, pp. 26-27.

Primary Examiner—Jerry Smith
Assistant Examiner—Paul Gordon
Attorney, Agent, or Firm—William Stepanishen; Donald J. Singer

[57] ABSTRACT

A method of cloning printed wiring boards by milling one side of the board to a minimum thickness, then X-raying the board to produce a film negative. This negative is photographed to provide a reversed negative which is converted to a diazo photograph.

11 Claims, 1 Drawing Sheet

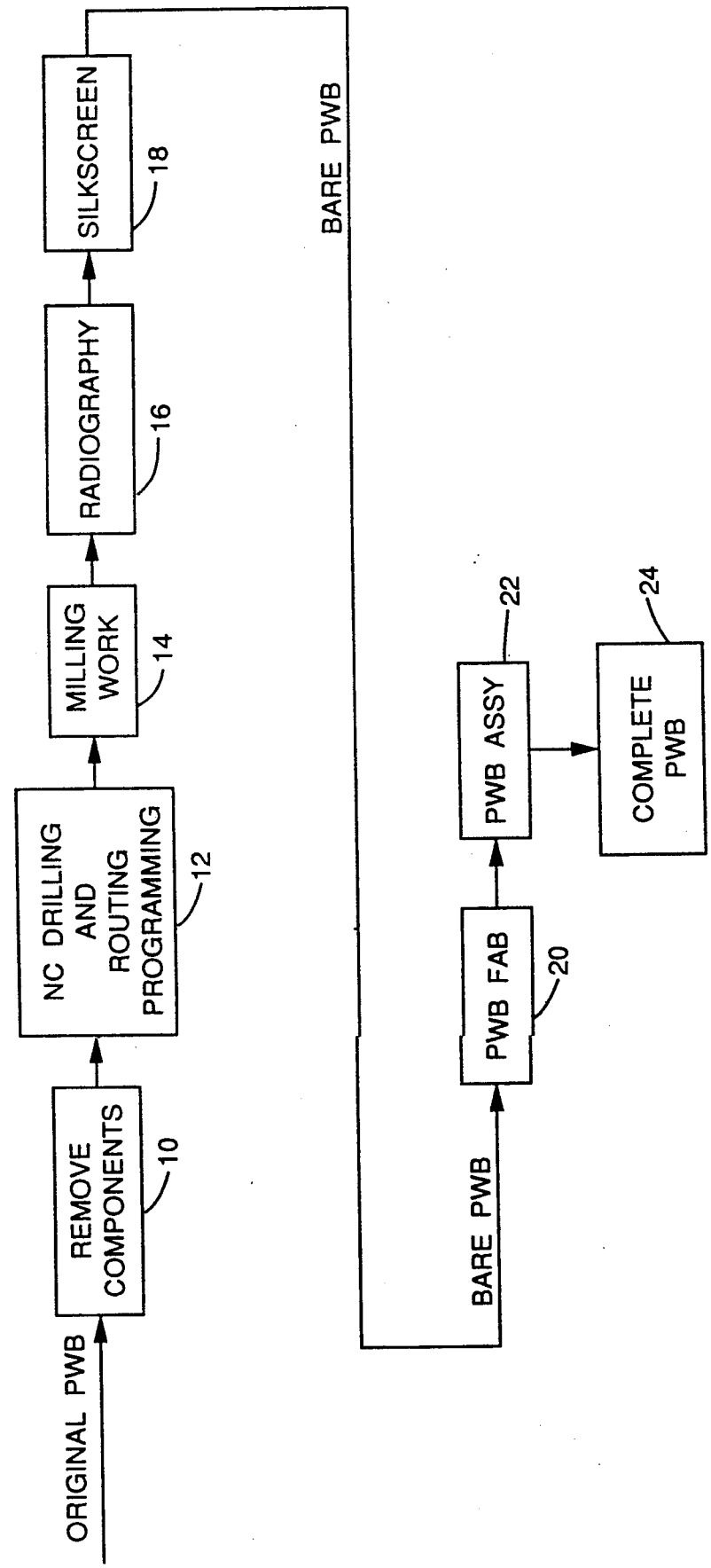

METHOD OF CLONING PRINTED WIRING BOARDS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to a method of reverse engineering of printed wiring boards and, more particularly, to the cloning of printed wiring boards to produce an exact replica of the original.

The state of the art of circuit reverse engineering is well represented and alleviated to some degree by the prior art apparatus and approaches which are contained in the following U.S. patents:

U.S. Pat. No. 3,564,358 issued to Hahnlein on Feb. 16, 1971;

U.S. Pat. No. 3,430,564 issued to Silvia et al on Mar. 4, 1969;

U.S. Pat. No. 3,721,838 issued to Brickman et al on Mar. 20, 1973; and

U.S. Pat. No. 4,766,516 issued to Ozdemir et al on Aug. 23, 1988.

The Hahnlein patent discloses an integrated circuit structure having several silicon layers electrically isolated and capacitively decoupled from each succeeding layer by means of intermediate insulting layers of aluminum silicates, said layers being successively deposited on a silicon substrate.

The Silvia et al patent discloses an all secondary explosive, logic and switching device in which a point contact from an explosive trail with a constricted region of the same or other explosive trail can produce a destructive cross-over, an explosive gate, diode and switch or other logic operation.

The Brickman et al patent is directed to an electrically alterable bistable element, typically an amorphous chalcogenide or amorphous metal-oxide, is connected in the circuit of a monolithic device and adapted to be electrically programmed for substitution of a circuit element or groups of circuit elements for other elements. The ability of a monolithic device to be repaired increases yields in manufacturing, lowers cost and extends the lifetime of such devices.

The Ozdemir et al patent discusses the method and apparatus for securing integrated circuits from unauthorized copying and use wherein at least one additional circuit element that does not contribute toward the integrated circuit's circuit function, but inhibits proper functioning of the integrated circuit in case of an attempted copying or other unauthorized use. The identity of the additional circuit elements is disguised by forming the with the visible appearance of an apparent element but with a physical modification which is not readily visible but causes them to function in a different manner, by providing different ICs with unique control codes, or both. Physical modifications not readily visible to a copyist include very narrow open circuit cuts in metalized connection lines, preferably with a focused ion beam or laser beam; and/or disordering the lattice structure or changing the doping level of a semiconductor region, and/or injecting electrical charge into a semiconductor region, preferably with an electron beam. The additional elements can be formed into a control code subcircuit for the IC, with the code disguised by the use of apparent elements.

Many older boards are lacking data for reproducing during surge requirements. In many cases the companies that produced the boards originally are no longer in business. The only alternative is to reverse engineer the boards at great cost in time and manpower. There was a critical need to find a fast, cost-effective way to reproduce the needed data to build new boards.

While the above-cited references are instructive, there still remains a need to provide a method of cloning printed wiring boards to produce an exact replica of the original board. The present invention is intended to satisfy that need.

SUMMARY OF THE INVENTION

The present invention is a method of cloning printed wiring boards and can produce finished artwork exactly the same as the original in a single day. The front of one board and the back of the other is milled off down to 15-20 thousands of an inch, then an X-ray film of the board is made by using radiography. The X-ray film is rephotographed using a process camera and single emulsion film. These photographs are then used to produce the diazos for the reproduction of the boards. The silk screen is produced by etching away the tin lead from the surface of the board then using a combination of filters on the process camera using negative film to pick up the printing on the boards.

It is one object of the present invention, therefore, to provide an improved method of cloning printed wiring boards.

It is another object of the invention to provide an improved method of cloning printed wiring boards that provides an exact duplicate of the original board.

It is still another object of the invention to provide an improved method of cloning printed wiring boards that will produce a cloned original board to MIL-Standard accuracy.

It is yet another object of the invention to provide an improved method of cloning printed wiring boards wherein the artwork can be digitized and passed directly to CAD/CAM work stations for any future rework requirements.

These and other advantages, objects and features of the invention will become more apparent after considering the following description taken in conjunction with the illustrative embodiment in the accompanying drawings.

BRIEF DESCRIPTION OF THE DRAWINGS

The sole Figure is a block diagram of the method of cloning printed wiring boards according to the present invention.

DETAILED DESCRIPTION OF THE PREFERRED EMBODIMENT

Referring now to the sole Figure, there is shown a block diagram of the method of cloning printed wiring boards. The first step 10 of the printed wiring board cloning method is the removal of components from the original printed wiring board. The information for programming, for drilling and routing is extracted from the board to produce the numerically controlled data in step 12. The printed wiring board proceeds to a milling station 14 where one side of identical boards are milled to remove the respective artwork. The boards are then delivered to a radiography station 16 whereupon each side of the respective boards is X-rayed to produce a negative film of the side. The radiographic film is then photographed in reverse 1:1 ratio to produce the artwork by which an exact duplicate of the original printed wiring board is produced. The printed wiring board artwork is utilized by the printed wiring board fabrication station 20 to manufacture as many printed wiring boards as may be required which are exact clones or duplicate of the original printed wiring board. The fabricated printed wiring boards are assembled into a completed copy of the original printed wiring board at the printed wiring board assembly station 22. The output or final product of the printed wiring assembly station 22 is the completed printed wiring board 24 which after assembly contains all the components specified for the original printed wiring board.

This new process produces artwork for printed wiring boards for which there is no supporting data. At present, the process has been applied only to single-sided, double-sided, and singlelayer flex print boards which comprise 80 percent of the printed wiring boards. It will also work on multi-layered boards once the separation of layers has been perfected.

The process starts with two original assets in working order. With all components removed from the undamaged boards, the type of laminate and copper thickness are determined. Milling the front off one board and the back off the other down to 10-20 thousands of an inch, both sides are X-rayed, at 10 MA, 50 KV for one minute at five feet, with Kodak M-2 film. Setting for time, power, and materials will vary according to the board specimens. The X-ray film produces a negative which is rephotographed using a process camera and single emulsion film (Kodak Precision LPF-7). Film selection will be determined by results required. This eliminates distortion on trace edges and cleans up the background impurities producing a 1:1 reversal of the X-ray negative.

This new piece of artwork is an exact clone of the original board, accurate to 1/1000 of an inch. The process is able to hold a 2-Mil trace without distortion.

This negative is then used to make the diazo from which additional boards are produced. The tin lead is stripped from the pads using acidic fluoride based oxidizer to more clearly expose the printed information on the board. The white printing on the boards is photographed through a magenta filter which blackens the green background of the boards and highlights the white printing. This negative is produced 1:1 and will be used to produce the silkscreen for the new boards. The solder mask information is produced using a precision engineered process camera with a 1:9, F 600 mm/24 in. lens. Back lighting the board and photographing the light coming through the holes in the board, the holes appear as black dots when the film is developed. The negative is then programmed through an OPIC-3B numerically controlled programmer which produces a tooling tape that gives the X-Y coordinates of the holes and the drill sizes. This allows for the production of an overdrilled entry panel. Then a contact print is made from the entry panel which in turn produces the required solder mask. This concludes the process of making the photo tools to create a complete printed wiring board data package. From this point, the printed wiring board is manufactured in the normal manner.

Although the invention has been described with reference to a particular embodiment, it will be understood to those skilled in the art that the invention is capable of a variety of alternative embodiments within the spirit and scope of the appended claims.

What is claimed is:

1. A method of cloning printed wiring boards comprising the steps of:
   a) removing all components from the printed wiring boards,
   b) drilling holes and routing component interconnection points on said printed wiring boards,
   c) milling the opposite sides of said printed wiring boards to a predetermined thickness,
   d) exposing said printed wiring boards to radiography to produce a film negative,
   e) photographing said film negative to provide a reversed film, and
   f) converting said reversed film to a diazo photograph.

2. A method of cloning printed wiring boards, as recited in claim 1, wherein said removing step includes the removal of all circuit components from two identical printed wiring boards.

3. A method of cloning printed wiring boards, as recited in claim 1, wherein said drilling step is numerically controlled.

4. A method of cloning printed wiring boards, as recited in claim 1, wherein milling step includes milling the front and back circuitry respectively off two identical printed wiring boards.

5. A method of cloning printed wiring boards, as recited in claim 1, wherein said predetermined thickness is approximately 15-20 thousands of an inch.

6. A method of cloning printed wiring boards, as recited in claim 1, wherein said radiography comprises X-rays at 10 MA, 50 KV for one minute at five feet.

7. A method of cloning printed wiring boards, as recited in claim 1, wherein said reversed film comprises a 1:1 reversal of said film negative.

8. A method of cloning printed wiring boards, as recited in claim 1, wherein said diazo photograph comprises a diazo emulsion on a mylar film.

9. A method of cloning printed wiring boards, as recited in claim 1, further including the step of:
   g. programming said diazo photograph film through a numerically controlled programmer to produce a tooling tape that gives X-Y coordinates of required holes and the drill sizes.

10. A method of cloning printed wiring boards, as recited in claim 1, further including the step of:
    photographing said printed wiring boards, after said milling step with a process camera utilizing filters to bring out the lettering on a negative, single-emulsion film which is used to produce the silkscreen.

11. A method of cloning a printed circuit wiring board, said board to be cloned having components on both sides thereof, and having component interconnection points thereon, comprising the steps of:
    a. removing all components from first and second identical printed wiring boards which are to be clones;
    b. drilling holes and routing component interconnection points on each of said printed wiring boards;
    c. milling one side of the first of said boards to a predetermined depth to remove all of the wiring on said one side;

d. milling opposite side of the second of said boards to a predetermined depth to remove all of the wiring on said opposite side;

e. exposing each of said printed wiring board to radiograph to produce a film negatives of each of said boards;

f. photographing said film negatives to provide reversed films; and g. converting said reversed films to a diazo photograph.

* * * * *